(12) United States Patent
Yiu et al.

(10) Patent No.: US 6,180,964 B1
(45) Date of Patent: Jan. 30, 2001

(54) LOW LEAKAGE WIRE BOND PAD STRUCTURE FOR INTEGRATED CIRCUITS

(75) Inventors: Ho-Yin Yiu; Lin-June Wu, both of Hsin-Chu; T. Cheng, Kaoshung, all of (TW)

(73) Assignee: Taiwan Semiconductor Manufacturing Co., Ltd, Hsin Chu (TW)

( * ) Notice: Under 35 U.S.C. 154(b), the term of this patent shall be extended for 0 days.

(21) Appl. No.: 09/205,112

(22) Filed: Dec. 3, 1998

(51) Int. Cl.$^7$ .......................... H01L 29/74; H01L 31/111
(52) U.S. Cl. .......................... 257/121; 257/119; 257/109; 257/112; 257/126; 257/772; 257/773; 257/784
(58) Field of Search ........................ 257/121, 119, 257/109, 112, 126, 772, 773, 784

(56) References Cited

U.S. PATENT DOCUMENTS 4,967,243 * 10/1990 Baliga et al. .................... 357/23.4

* cited by examiner

Primary Examiner—Minh Loan Tran
Assistant Examiner—Luan Thai
(74) Attorney, Agent, or Firm—Tung & Associates

(57) ABSTRACT

An improved bond pad structure for semiconductor devices provides improved electrical isolation between adjacent bond pads by incorporating a pair of pn junctions between the pad and substrate. The pn junctions are defined by a first well of either P of N type material, formed within a substrate, and a second well or region of a P or N type material formed wholly within the first well. A bond wire is secured to an upper surface of the second region such that the wire, first and second regions and substrate are connected in electrical series relationship and provide an equivalent circuit of two series connected diodes reversed in polarity so as to block both negative and positive components of an applied voltage, thus providing electrical isolation for the bond pad structure.

10 Claims, 3 Drawing Sheets

LOW LEAKAGE WIRE BOND PAD STRUCTURE FOR INTEGRATED CIRCUITS

FIELD OF THE INVENTION

The present invention generally relates to bond pads formed on semiconductor devices, and deals more particularly with a bond pad structure which prevents leakage current between adjacent bond pads, as well as to a method of making such structures.

BACKGROUND OF THE INVENTION

As part of the process for fabricating semiconductor devices, an integrated circuit chip is frequently assembled in a package in a final process step to complete the fabrication process. The assembled package can then be connected to a printed circuit board as part of a larger circuit to establish an electrical connection between the integrated circuit chip and the board. A wire bonding process is frequently used to connect the multiplicity of bond pads formed on the integrated circuit to the outside, or surrounding circuitry.

In a typical integrated circuit chip, active circuit elements such as transistors, resistors, capacitors, etc., are positioned in the central portion, i.e., the active region of the chip while the bond pads are normally arranged around the periphery of the active region, so that the active circuit elements are not likely to be damaged during a subsequent bonding process. When a wire bonding process is performed on a bond pad formed on an IC chip, the process normally entails the bonding of a gold or aluminum wire to the bond pad by fusing the two together with ultrasonic energy. The wire is then pulled so as to stretch the wire away from the bond pad after the bond between the wire and the pad is formed.

As the complexity and density of IC chips continues to increase, the number of adjacent bond pads and their proximity to each other increases. Because the bond pads are normally formed on a common semiconductor substrate, electrical current sometimes leaks between adjacent bond pads through the substrate, thus giving rise to reduced signal level, signal errors, or even short circuits producing circuit malfunction.

Accordingly, there is a clear need in the art for an improved bond pad structure that exhibits improved electrical isolation between adjacent bond pads, thereby preventing leakage currents between the pads. The present invention is directed to satisfying this need in the art.

SUMMARY OF THE INVENTION

According to one aspect of the invention, an improved bond pad structure for semiconductor devices is provided which exhibits increased electrical isolation between adjacent pads and prevents current leakages between the pads which contributes to device malfunction. The bond pad structure comprises a well of P+ or N+ types of semiconductor material formed in a semiconductor substrate of a P+ or N+ type material opposite that of the well. A region of P+ or N+ type material identical to that of the substrate is formed within the well and includes an exposed surface onto which a bonding pad is formed. P+ or N+ type materials are chosen for the substrate, well and regions within the well so as to form two pn interfaces through current must flow between the bond pad and the substrate. These two pn interfaces or junctions provide the electrical equivalent of two diodes connected in series and arranged in opposite polarity so as to provide isolation, regardless of whether a positive or negative voltage is applied to the bond pad.

According to another aspect of the invention, a semiconductor bond pad structure is provided comprising a semiconductor substrate of one of a P+ or N+ material, and a plurality of first regions defined in the substrate and formed of a semiconductor material of the other of P+ or N+ type materials, the interface between each of the first regions in a substrate defining a first pn junction. A plurality of second regions are respectively formed within the first regions and include the same P+ or N+ type materials selected for the substrate; the interface between each of the first and second regions define a second pn junction. A plurality of bonding pads are respectively formed on the surface of the second regions, whereby electrical current passing through the bonds and the substrate flows through the respectively associated first and second regions. The first and second pn regions provide the electrical equivalent of a pair of reverse connected diodes that provide electrical isolation preventing leakage current between adjacent ones to the bonding pads.

According to another aspect of the invention, a method is provided for forming a semiconductor bond pad structure, which comprises the steps of. (A) providing a semiconductor substrate of one of a P+ or P– type material; (B) forming a plurality of first regions within the substrate of the other of the P+ or P– type materials; (C) forming a plurality of second regions respectively within the first regions, the second regions being of the same P+ or P– type of materials as the substrate; and, (D) forming a plurality of bonding pads respectively on the surface of the second regions, the first and second regions providing electrical isolation preventing leakage current between adjacent ones on the bonding pad.

Accordingly, it is a primary object of the present invention to provide a bonding pad structure for semiconductor devices which substantially reduces or eliminates leakage currents through the bond pads and thus exhibits better electrical isolation between adjacent bond pads.

Another object of the present invention is to provide a bond pad structure as describe above which may be easily and reliably manufactured using common semiconductor processing techniques.

Another object of the present invention is to provide a bond pad structure as described above which achieves electrical isolation between adjacent bond pads for the application of both positive and negative voltages to the pads.

A still further object of the present invention is to provide a method of forming a bond pad structure which includes a minimum of conventional, reliable processing steps.

These, and further objects and advantages of the present invention will be made clear or will become apparent during the course of the following description of a preferred embodiment of the invention.

BRIEF DESCRIPTION OF THE DRAWINGS

In the drawings, which form an integral part of specification, and are to be read in conjunction therewith, and wherein which like reference numerals are employed to designate identical components in the various views.

DETAILED DESCRIPTION OF THE PREFERRED EMBODIMENT

Figure 1:
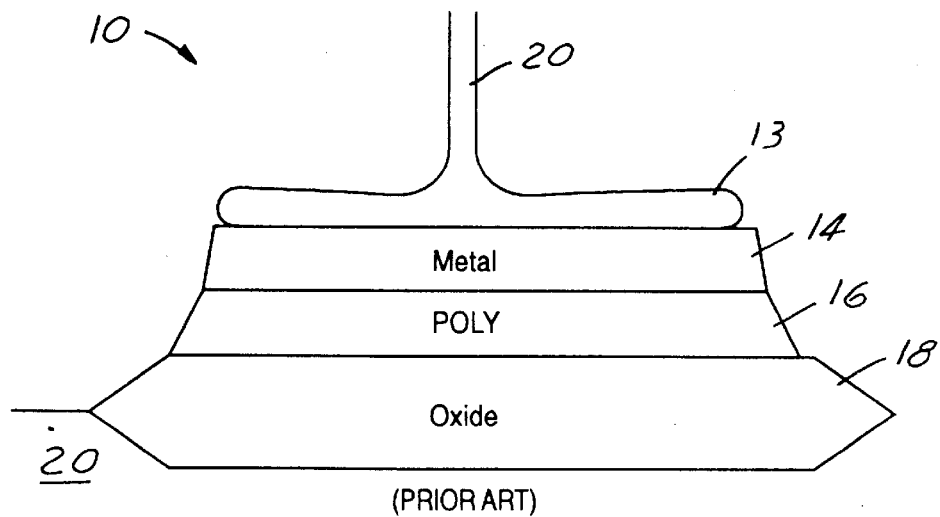
FIG. 1 is an enlarged cross-sectional view of a conventional bond pad structure having a wire bonded thereon.

Attention is first directed to FIG. 1 which depicts a conventional bond pad structure 10 formed on a silicon substrate 20 by first forming a bird's beak field oxide region 18 in the surface layer of the substrate 12. On top of the field oxide region 18, a conductive layer of material such as polysilicon is deposited and formed by a photolithography method into a polysilicon layer 16. On top of the polysilicon layer 16, a metal layer 14 such as WSi, TiSi or TaSi is then deposited. In a subsequent annealing process a polysilicide layer (not shown) may be formed at the interface between the polysilicon layer 16 and the metal layer 14. On the top surface of the metal layer 14, a wire bond is formed which comprises a metal wire 12 bonded to the metal layer 14 by means of a solder material 13. During the bonding process, once a bond is formed between the solder 13 and the metal surface 14, the metal wire 12 is pulled away for making connection with a lead finger (not shown).

The bond structure 10 shown in FIG. 1 is typical of prior art arrangements wherein a multiplicity of bond pads are formed around the periphery of an IC device and are closely spaced to each other, so that the conductive path between adjacent bond pads through the underlying substrate is relatively short. The nature of the bond pad structure 10 shown in FIG. 1, combined with the close proximity between adjacent bond pads often gives rise to leakage current between adjacent pads since bond pad structures conduct stray signals therethrough, i.e. the bond pad structure does not include any means for isolating the conduction of stray or unwanted signals.

Figure 2:
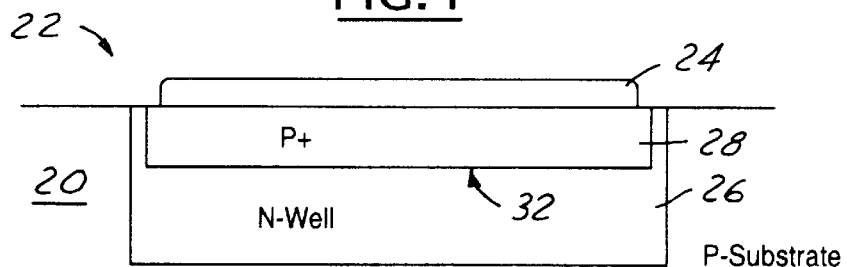
FIG. 2 is a diagrammatic, cross-sectional view of a portion of a semiconductor device showing one form of the improved bond pad structure of the present invention, the bond wire not being shown for purposes of simplification.

Referring now to FIG. 2, the present invention relates to an improved bond pad structure 22 exhibiting good electrical isolation characteristics which prevent leakage of current between adjacent pads conducted through the substrate. The bond pad structure 22 comprises a first region of material in the form of a well 26 of N+ or N− material formed within a semiconductor substrate 20 of P+ material. The well 26 may be formed by conventional semiconductor processing techniques including diffusion or ion implantation techniques. In the upper portion of the well 26, there is formed a second region or well of a P+ type material. This second region 28 is wholly contained within the first region or well 26 and, in the present embodiment, has an upper surface co-planar with that of the substrate 20. A metal bond pad 24 is formed on top of the upper surface on the second P+ region 28, and consists of the metals used in the bond pad structure previously described with reference to FIG. 1. For the sake of simplification, the actual wire bond is not shown in FIG. 2, but it is to be understood that a conventional wire is attached to the metal pad 24 by means of a solder material, similar to that shown in FIG. 1.

Figure 3:
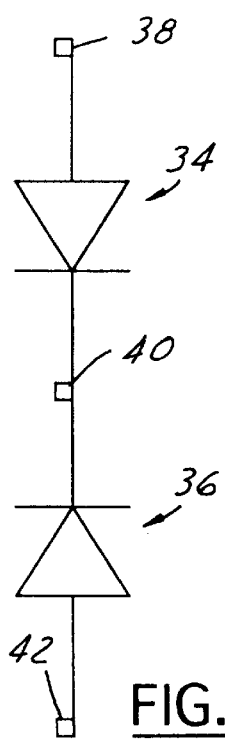
FIG. 3 is a schematic diagram of an equivalent circuit of the bond pad structure shown in FIG. 2.
Figure 4A:
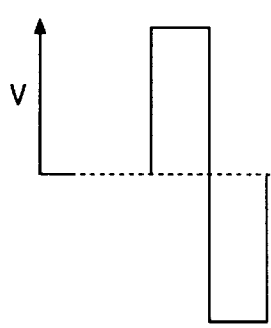
FIGS. 4(a)-(c) are waveform diagrams showing the signal present at various points in the circuit in FIG. 3.
Figure 4B:
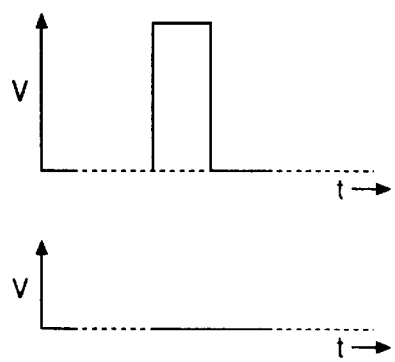
Figure 4C:

Since the substrate 20, well 26 and region 28 are respectively formed of P+, N and P+ materials, it may be appreciated that there exists two pn junctions 30, 32, i.e. a first pn junction floating between the substrate 20 and the well 26, and a second pn junction 32 between the—well 26 and the P+ region 28. It may also be appreciated that since the P+ region 28 is wholly disposed within the N well 26, electrical current must necessarily flow in a series circuit through the two pn junctions 30, 32 between the bond pad 24 and substrate 20. In effect, the unique bond pad structure 22, and particularly the two pn junctions 30, 32 provide an electrically isolated circuit, which is represented in FIG. 3 that depicts two diodes 34, 36 connected in series, but reversed in polarity. This arrangement prevents unwanted conduction of signals regardless of whether the applied voltage is positive or negative. For example, FIG. 4(a) shows the application of a voltage signal having positive and negative components applied at terminal 38 in FIG. 3, which is the equivalent of the metal pad 24 in FIG. 2. As can be seen in FIG. 4(a), both positive and negative components of the applied voltage are present. However, the diode 34 blocks the negative component of the signal, such that the signal appearing at point 40 in FIG. 3 is that shown in FIG. 4(b), which reveals that the negative component has been blocked. The diode 36 blocks the positive component of the voltage so that the signal appearing at point 42 in FIG. 3 is that shown in FIG. 4(c) i.e. the positive and negative components of the applied voltage have been blocked, thus achieving electrical isolation between the wire bond and the substrate regardless of whether a positive or negative voltage is applied.

Figure 5:
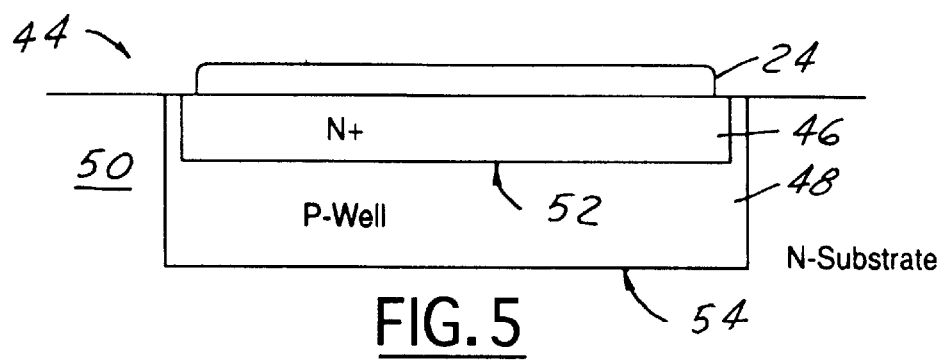
FIG. 5, is a view similar to FIG. 2, but depicting an alternate form of the bond pad structure of the present invention.
Figures 6, 7A, 7B, 7C:
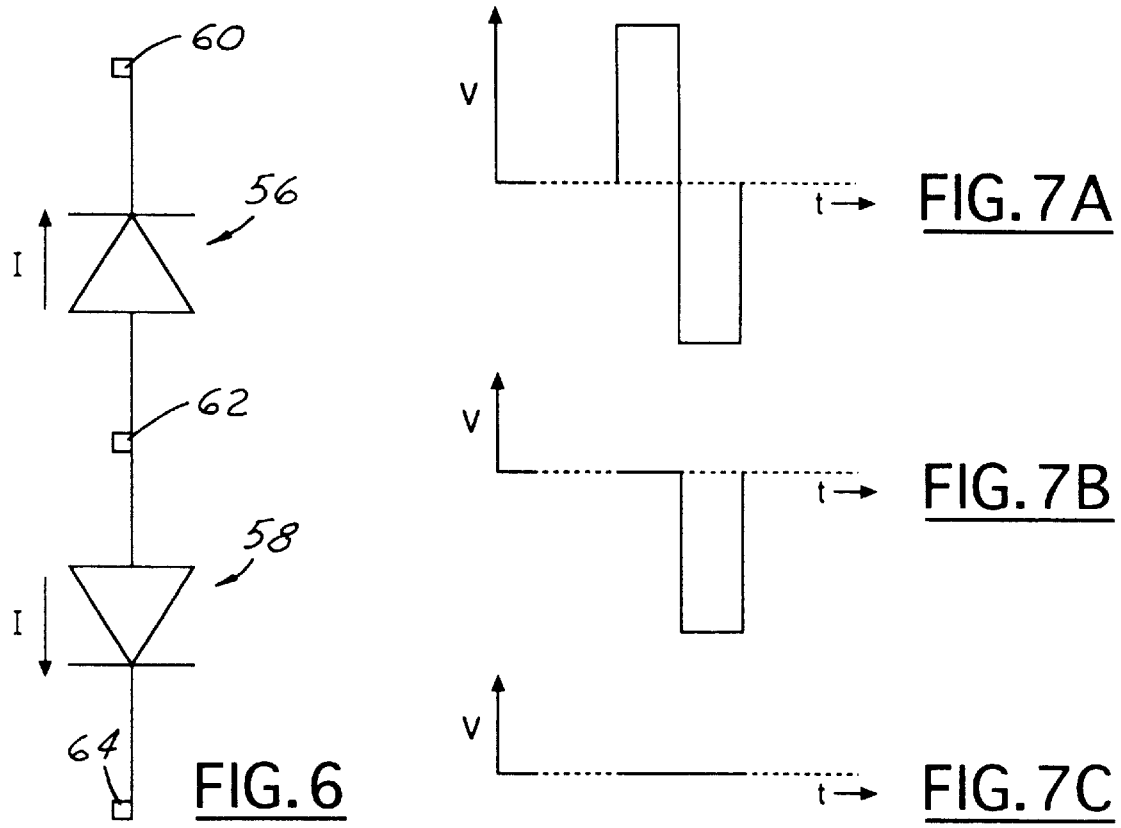
FIG. 6 is a schematic diagram of an equivalent circuit of the bond pad structure shown in FIG. 5.
FIGS. 7(a)-(c) are waveform diagrams showing the signals present at various points in the circuit of FIG. 6.

Attention is now directed to FIG. 5 which depicts an alternate form of the bond pad structure 44 the present invention, which is essentially identical to that show in FIG. 2 in terms of configuration and geometry, but employs a different arrangement of materials. The bond pad structure 44 employs an N+ substrate 50 and uses a P+ or P− first region or well 48, and an N+ second region 46 wholly disposed within the well 48. Thus, the substrate 50, well 48 and region 46 are respectively formed by N+, P+ and N+ type materials which result in a pair of pn junctions 52 and 54. The equivalent circuit of the bond pad structure 44 is shown in FIG. 6, where again, two diodes 56, 58 are connected in series but reversed in polarity. Thus, a voltage signal applied at point 60 has positive and negative components as shown in FIG. 7(a), and the presence of the diode 56 blocks the positive components of the voltage so that the signal present at point 62 consists only of the negative voltage components, as shown in FIG. 7(b). The second diode 58 blocks the negative components of the voltage so that the signal present at point 64 as shown in FIG. 7(c) is devoid of either positive or negative components. Again, it may be appreciated that the bond pad structure 44 provides complete signal isolation, thus precluding stray or leakage currents from passing through the bond pad structure to the substrate portions of the device, including adjacent bond pads.

The novel bond pad structure described above may be manufactured using common, well-known semiconductor processing techniques as previously described. Broadly, however, the method of forming the bond pad structure of the present invention comprises the steps of: (A) providing a semiconductor substrate of one of a P+ or N+ type of material; (B) forming a plurality of first regions in the substrate of the other of an P+ or N+ type of material; (C);

forming a plurality of second regions respectively within the first regions, the second regions being of the same N+ or P+ type material as the substrate; and (D) forming a plurality of bond pads respectively on the surface of the second regions. The P+ or N+ regions described above may be achieved through diffusion or ion implantation as well as other suitable techniques.

Figure 8:
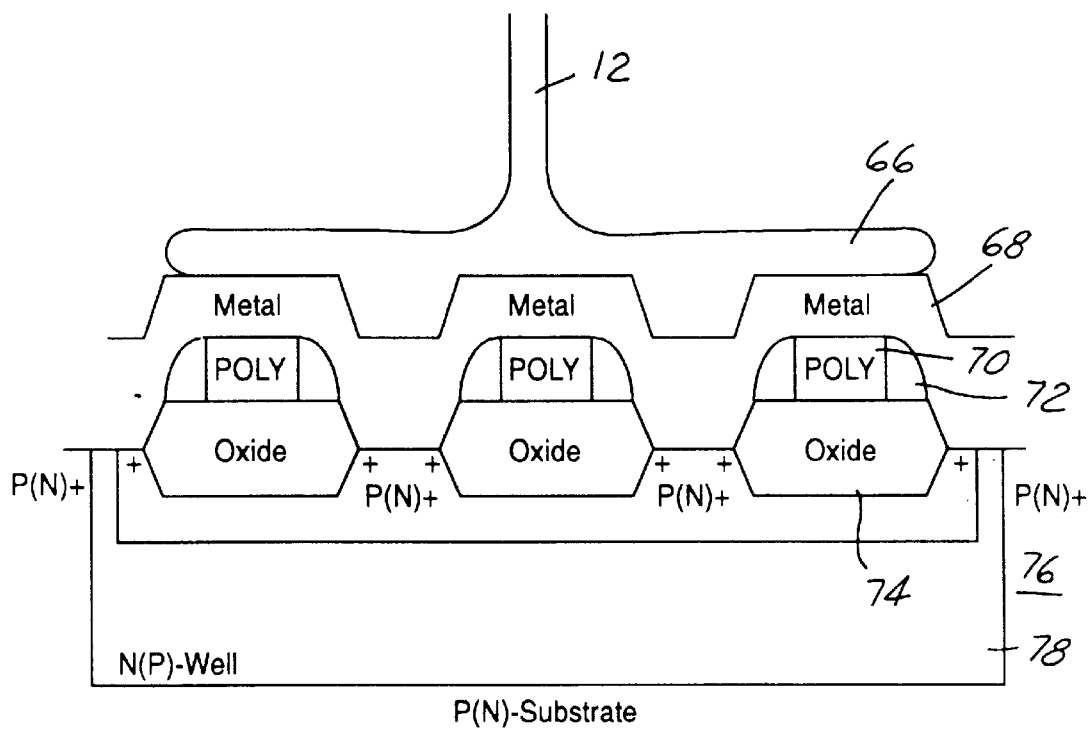
FIG. 8 is an enlarged, cross-sectional view of an electronic device substrate showing another alternate form of the bond pad structure of the present invention.

Reference is now made to FIG. 8 which depicts an alternate bond pad structure in accordance with the present invention which not only exhibits the improved electrical isolation characteristics of the bond pad structures previously described, but also provide stress buffered characteristics such that bond pad lift off defects can be substantially eliminated.

The bonding wire 12 is bonded to the top surface of a metal layer 68 by means of a solder material 66. By utilizing polysilicon gates 70, a stepped surface is produced. The bonding strip on the top surface of the metal layer 68 should therefore be more advantageously distributed during a bonding process to avoid bond pad lift off defects. The polysilicon gates 70 are formed on the bird's beak oxide layers 74 formed in the upper surface of the semiconductor substrate 76. In this case, the substrate is of a P− type, and there is formed an N+ well 78 that leads to the bird's beak oxide layers 74.

Figure 9:
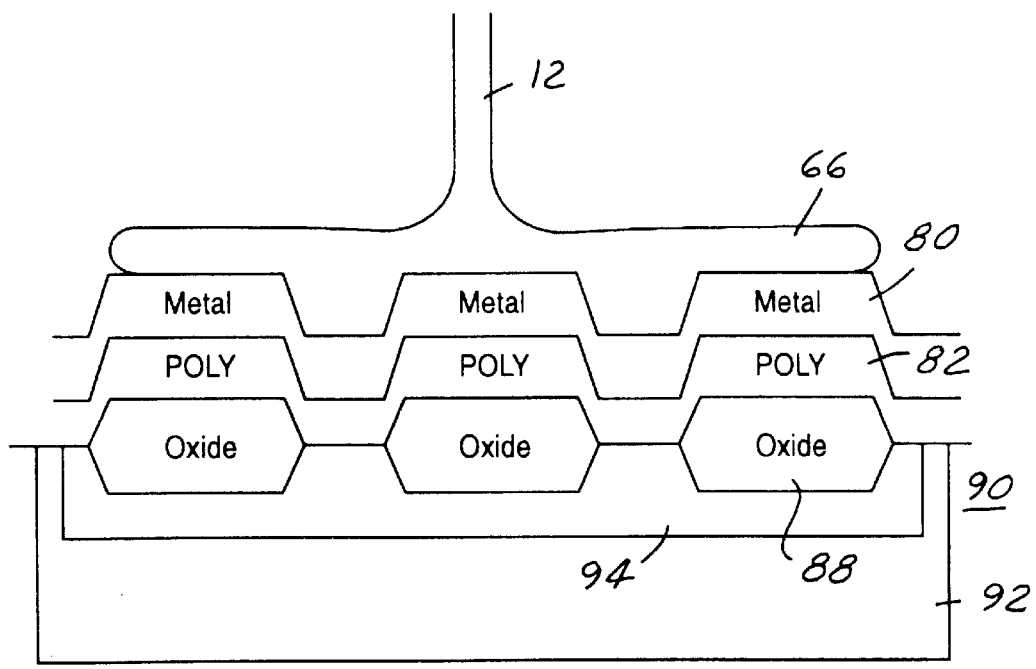
FIG. 9 is an enlarged, cross-sectional view of a semiconductor device substrate depicting a still further form of the bond pad structure of the present invention.

FIG. 9 shows another alternate form of a bond pad structure wherein a wire 12 is secured by solder 66 to the upper surface of a stepped metal layer 80. As in the case of the embodiment shown in FIG. 8, the stepped metal surface 80 distributes the bonding stress more evenly during both the wire planting and wire pulling away steps, to thereby prevent pad lift off. The stepped metal layer 80 is applied over a stepped layer of polysilicon, which is in turn formed over bird's beaks oxide layers 88. Again, a well 92 of either P+ or N+ material is provided beneath the bird beaks oxide layers 88 so as to form a pn junction between the well 92 and the substrate 90 and a second pn junction between the material of the well 92 and the regions 94 immediately beneath the bird's beak oxide layer 88.

Other details of the construction and methods of manufacture of the embodiments shown in FIGS. 8 and 9 are disclosed in co-pending U.S. patent application Ser. No. 09/102,309 filed Jun. 22, 1998, the entire disclosure of which is incorporated herein by reference.

From the foregoing, it is apparent that the novel bond pad structure and method for making same described above not only provide for the reliable accomplishment of the objects of the invention but do so in a particularly effective and economical manner. It is recognized, of course, that those skilled in the art may make various modifications or additions to the preferred embodiments chosen to illustrate the invention without departing from the spirit and scope of the present contribution to the art. Accordingly, it is to be understood that the protection sought and to be afforded hereby shall be deemed to extend to the subject matter claimed and all equivalents thereof fairly within the scope of the invention.

What is claimed is:

1. A wire bond pad structure for preventing the flow of leakage current between adjacent wire bond pads formed on the periphery of an integrated circuit to connect active circuit regions of the integrated circuit with external circuitry, comprising:

a semiconductor substrate of one of a P or N type material;

a first region defined in said substrate and formed of a semiconductor material of the other of said P or N type material;

a second region of said one of said P or N type materials wholly disposed within said first region;

a wire bond pad formed on the surface of said second region, said first and second regions forming a pair of series connected, reverse pn junctions preventing forward and reverse current flow therethrough, and providing electrical isolation between said wire bond pad and adjacent ones of said pads when voltage is applied to said wire bond pad.

2. The bond pad structure of claim 1, wherein said first region is a well of the other of said P or N type material formed within said substrate.

3. The bond pad structure of claim 1, wherein:

said substrate is formed of a P type material, said first region is formed of an N type material, and said second region is formed of a P type material.

4. The bond pad structure of claim 1, wherein:

said substrate is formed of an N type material, said first region is formed of an P type material, and said second region is formed of an N type material.

5. A wire bond pad structure for preventing the flow of leakage current between adjacent wire bond pads formed on the periphery of an integrated circuit to connect active circuit regions of said integrated circuit with external circuitry, comprising:

a semiconductor substrate of one of a P or N type material;

a first region defined in said substrate and formed of a semiconductor material of the other of said P or N type material, the interface between said first region and said substrate defining a first pn junction;

a second region wholly formed within said first region and formed of said one of said P or N type materials, the interface between said first and second regions defining a second pn junction;

a wire bond pad formed on the surface of said second region, whereby all electrical current passing between said wire bond pad and said substrate flows through said first and second region, said first and second pn junctions defining a pair of series connected, reverse diodes preventing forward and reverse current flow therethrough, and providing electrical isolation between adjacent ones of said pads when voltage is applied to one of said pads.

6. The bond pad structure of claim 5, wherein the wire bond pad, first region, second region and said substrate define the only electrical current path between said wire bond pad and an adjacent one of said pads.

7. The bond pad structure of claim 5, wherein said first region is a well of the other of said P or N type material formed within said substrate.

8. The bond pad structure of claim 5, wherein:

said substrate is formed of a P type material, said first region is formed of an N type material, and said said second region is formed of a P type material.

9. The bond pad structure of claim 5, wherein:

said substrate is formed of an N type material, said first region is formed of an P type material, and said second region is formed of an N type material.

10. The bond pad structure of claim 5, wherein said substrate, said first and said second pn junctions provide the electrical equivalent of a pair of reverse connected diodes.

\* \* \* \* \*